United States Patent
Chien et al.

(10) Patent No.: US 8,252,515 B2
(45) Date of Patent: Aug. 28, 2012

(54) METHOD FOR REMOVING PHOTORESIST

(75) Inventors: Chin-Cheng Chien, Tainan Hsien (TW);
Chan-Lon Yang, Taipei (TW);
Chiu-Hsien Yeh, Tainan (TW);
Che-Hua Hsu, Hsinchu County (TW);
Zhi-Cheng Lee, Tainan (TW);
Shao-Hua Hsu, Taoyuan County (TW);
Cheng-Guo Chen, Changhua County (TW); Shin-Chi Chen, Tainan County (TW); Zhi-Jian Wang, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 351 days.

(21) Appl. No.: 12/577,729

(22) Filed: Oct. 13, 2009

(65) Prior Publication Data

US 2011/0086499 A1    Apr. 14, 2011

(51) Int. Cl.
*G03F 7/00*    (2006.01)
*G03F 7/004*   (2006.01)
*G03F 7/40*    (2006.01)

(52) U.S. Cl. .................. 430/311; 430/330; 430/331

(58) Field of Classification Search .................. 430/311, 430/330, 331
See application file for complete search history.

(56) References Cited

U.S. PATENT DOCUMENTS

| | | | | |
|---|---|---|---|---|
| 5,201,960 | A * | 4/1993 | Starov | 134/11 |
| 6,524,936 | B2 * | 2/2003 | Hallock et al. | 438/531 |
| 6,630,406 | B2 * | 10/2003 | Waldfried et al. | 438/710 |
| 6,951,823 | B2 * | 10/2005 | Waldfried et al. | 438/710 |
| 6,967,173 | B2 | 11/2005 | Smith et al. | |
| 7,159,599 | B2 * | 1/2007 | Verhaverbeke et al. | 134/109 |
| 7,361,605 | B2 * | 4/2008 | Savas et al. | 438/708 |
| 8,066,819 | B2 * | 11/2011 | Waleh et al. | 134/30 |
| 2007/0184996 | A1 | 8/2007 | Weng et al. | |
| 2008/0047580 | A1 * | 2/2008 | Kim et al. | 134/1.1 |
| 2008/0171682 | A1 * | 7/2008 | Kane et al. | 510/176 |
| 2008/0261384 | A1 * | 10/2008 | Sun et al. | 438/514 |
| 2008/0286697 | A1 * | 11/2008 | Verhaverbeke et al. | 430/322 |
| 2011/0039747 | A1 * | 2/2011 | Zhou et al. | 510/176 |
| 2011/0170181 | A1 * | 7/2011 | Yoshikawa et al. | 359/385 |

* cited by examiner

*Primary Examiner* — Amanda C. Walke
(74) *Attorney, Agent, or Firm* — Winston Hsu; Scott Margo

(57) ABSTRACT

A method for removing a photoresist is disclosed. First, a substrate including a patterned photoresist is provided. Second, an ion implantation is carried out on the substrate. Then, a non-oxidative pre-treatment is carried out on the substrate. The non-oxidative pre-treatment provides hydrogen, a carrier gas and plasma. Later, a photoresist-stripping step is carried out so that the photoresist can be completely removed.

13 Claims, 2 Drawing Sheets

etc. Persons of ordinary
METHOD FOR REMOVING PHOTORESIST

BACKGROUND OF THE INVENTION

1. Field of the Invention

The present invention relates to a method for removing a patterned photoresist. In particular, the present invention relates to a method to use a non-oxidative pre-treatment prior to removing a patterned photoresist so that the patterned photoresist is substantially influenced and can more easily be removed.

2. Description of the Prior Art

During the manufacturing process of semiconductors, a lithographic technique is often used together to transfer a pre-determined pattern into a substrate or to carry out a selective treatment on the substrate. During such process, a photoresist material layer is usually first uniformly formed on the substrate. Later, an exposure technique and a development technique are used to pattern the photoresist material layer to define a pre-determined layout structure of the semiconductor elements.

Removing the photoresist is usually the last step of the patterning technique or the selective treatment. It requires that the photoresist be completely and thoroughly removed to ensure the cleanness of the following steps. In the conventional methods, an oxygen-containing ashing procedure is mostly used to carry out a dry photoresist strip (dry PR strip), which uses an oxygen plasma to react with the photoresist material which is basically composed of hydrocarbons to remove it. The problem of residue ash which is caused by the photoresist material reacting with the oxygen plasma should be avoided. Besides, the silicon material in the substrate is susceptible to be consumed in this method.

Accordingly, another current method which uses a sulfuric-peroxide mix liquid (SPM) of high temperature is proposed. The sulfuric acid and the peroxide form Caro's acid to completely oxidize the photoresist material which is basically composed of organic compounds. This is called a wet photoresist strip (wet PR strip). On one hand, the photoresist material can be removed, and on the other hand this method makes the film layers which are covered by the photoresist material layer or the silicon material in the substrate much less susceptible to be consumed.

However, some manufacturing processes of semiconductor elements may substantially change the properties of the patterned photoresist material layer so that the sulfuric-peroxide mix (SPM) of high temperature can no longer completely remove the photoresist material layer from the substrate as expected. In order to conveniently remove the photoresist material layer, a novel method for removing a photoresist is therefore needed.

SUMMARY OF THE INVENTION

The present invention as s result proposes a novel method for removing a photoresist. The method of the present invention on one hand may conveniently remove the photoresist material layer, and on the other hand it keeps the poly line on the substrate intact. The method of the present invention may break the barrier of the conventional approaches and is suitable for use in semiconductor process.

A method for removing a patterned photoresist is disclosed. First, a substrate including a patterned photoresist is provided. Second, an ion implantation is carried out on the substrate. Then, a non-oxidative pre-treatment is carried out on the substrate. The non-oxidative pre-treatment provides hydrogen, a carrier gas and plasma. The non-oxidative pre-treatment may be carried out in a stepwise temperature. The concentration of hydrogen may be between 4%-40%. Besides, nitrogen gas may serve as the carrier gas. The plasma treatment condition may be the same as that of a plasma ashing step. Later, a photoresist-stripping step is carried out on the substrate to completely remove the photoresist. For example, a sulfuric-peroxide mix may be used to remove the photoresist. Or, an ammonia-peroxide mix may be used to remove the photoresist.

The method of the present invention is characterized in that the non-oxidative pre-treatment carried out on the substrate not only damages the photoresist but also keeps the poly line from further oxidization so that the photoresist is more easily stripped. Still, the method of the present invention keeps the poly line on the substrate intact.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
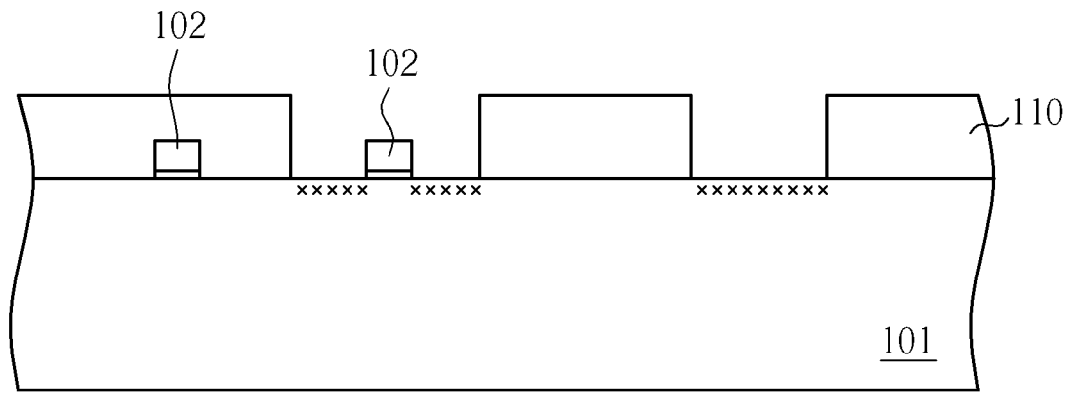
FIGS. 1 to 4 illustrate a preferred embodiment of the method for removing a patterned photoresist of the present invention.

The present invention provides a method for removing a photoresist. FIGS. 1 to 4 illustrate a preferred embodiment of the method for removing a photoresist of the present invention. The method of the present invention not only damages the photoresist but also keeps the poly line from further oxidization so that the poly line on the substrate remains intact. First, as shown in FIG. 1, a substrate 101 is provided. The substrate 101 is usually a semiconductor substrate, such as Si. The substrate 101 includes a patterned photoresist 110 disposed on the top side of the substrate 101, or further includes a material layer to be patterned or a poly line 102, such as a gate structure, word lines, bit lines, electrical resistances or fuse structures.

In accordance with different exposure conditions, the photoresist material layer may be a positive photoresist or a negative photoresist. In addition, in accordance with different wavelengths, the photoresist material layer may include various different organic materials, such as acrylate, vinyl ketone, or polyhydroxystyrene (PHS) . . . etc. Persons of ordinary skills in the art may choose suitable photoresist materials in accordance with different requirements.

Figure 2:
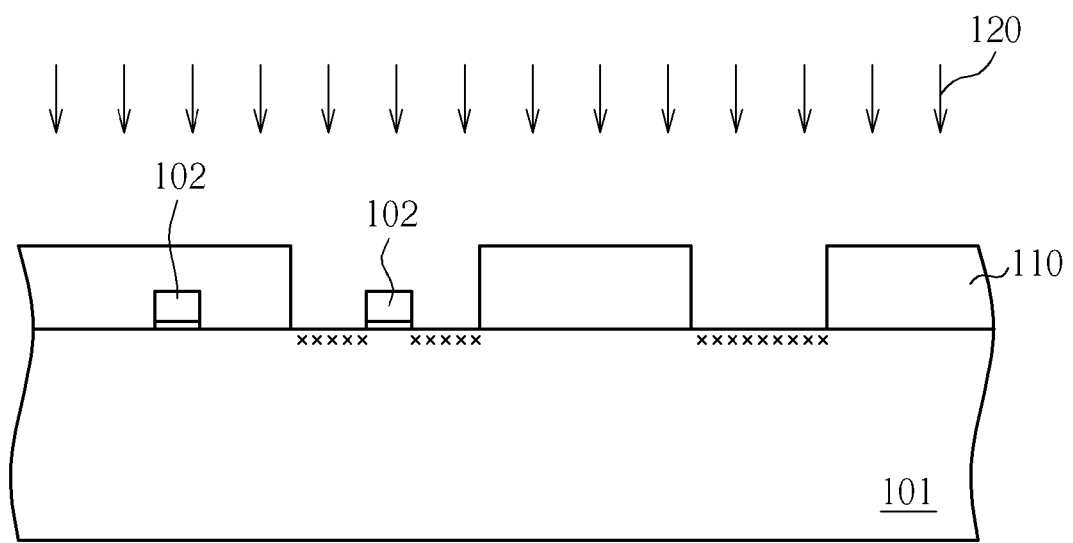

Next, as shown in FIG. 2, a semiconductor process, such as an ion implantation, a plasma treatment, or an etching procedure, is carried out on the substrate 101. Taking the ion implantation for example, the ion implantation may be any ion implantation which introduces dopant 120 into the substrate 101 which is not covered by a patterned photoresist, for instance but not limited to, a light drain doping (LDD), a drain ion implantation or a source ion implantation . . . etc. Such ion implantation step is used to dope the substrate 101 or the film layers thereon with dopant 120 but influences the properties of the patterned photoresist 110, for example, to have a hard shell surface and substantially change the properties of the patterned photoresist 110.

For instance, after some ion implantation steps, the properties of the patterned photoresist material layer are substantially changed due to the dopant of the ion implantation steps, to have a hard shell surface. Because of the hard shell, the patterned photoresist material layer becomes so hard that it can hardly be completely removed from the substrate by the sulfuric-peroxide mix (SPM) of high temperature as expected. In the light of this, it takes a much longer time to completely remove the photoresist material layer from the substrate. In such a way, although the photoresist material layer gets barely removed, the qualities of the patterned film layers, the poly line in particular, on the substrate are also collaterally damaged. Prolonged strip with the sulfuric-peroxide mix (SPM) of high temperature may seriously damage the poly line, or even make the poly line broken. The semiconductor elements thus fail.

Figure 3:
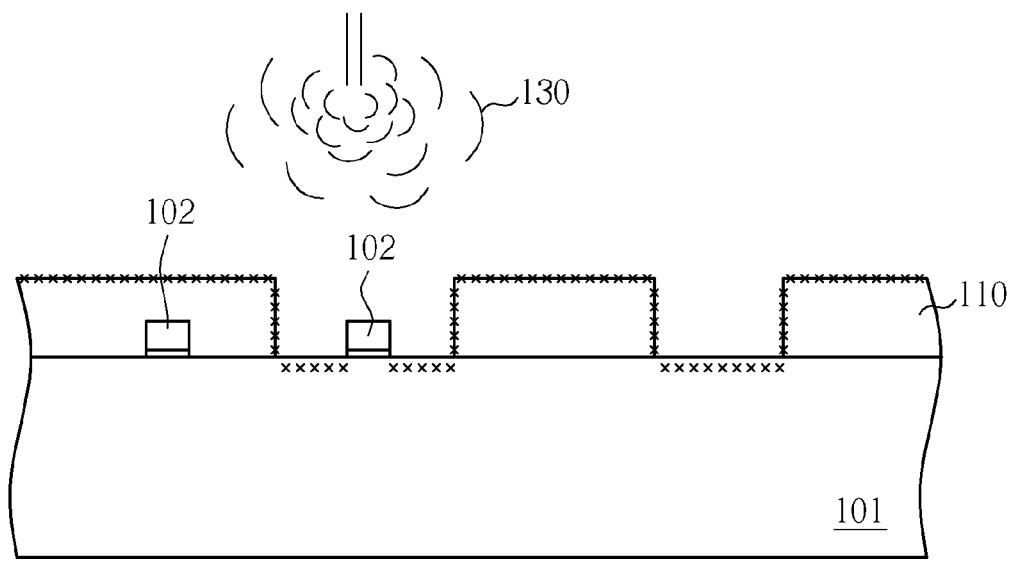

Then, as shown in FIG. 3, a non-oxidative pre-treatment is carried out on the substrate 101. Such non-oxidative pre-treatment provides a pre-treatment condition of hydrogen 130, a carrier gas and plasma to influence the photoresist 110. As described earlier, after the ion implantation step, the properties of the patterned photoresist material layer is changed due to the dopant of the ion implantation step to have a hard shell surface. The patterned photoresist material layer with the hard shell surface can hardly be completely and easily removed from the substrate 101 by the sulfuric-peroxide mix of high temperature in a short period of time. In the present invention, the non-oxidative pre-treatment is used to make the photoresist material layer much more susceptible to the chemical reaction of the sulfuric-peroxide mix of high temperature.

The non-oxidative pre-treatment provides hydrogen, a carrier gas and plasma. The concentration of hydrogen may be between 4%-40%. Besides, an inert gas such as nitrogen gas may serve as the carrier gas. During the non-oxidative pre-treatment, a stepwise temperature condition may be carried out. For example, the heat source is under the substrate 101 and the temperature is controlled at 250° C. The substrate 101 is first heated for 300 second away from the heat source then is heated for another 150 second close to the heat source. The plasma treatment condition may be the same as that of a plasma ashing step to partially change the photoresist 110, in particular the hard shell surface. It should be understood that the aforesaid parameters, such as temperature, time or the energy of the upper or lower electrode . . . etc., of the non-oxidative pre-treatment may be adjusted when a photoresist undergoes different semiconductor processes such as etching or implantation by different dopants, different implantation energy or different gas atmosphere of etching or of implantation with respect to different types of photoresists such as DUV photoresist or IR photoresist.

The non-oxidative pre-treatment is a kind of non-oxidative reaction. Such non-oxidative reaction uses no oxygen or other conventional oxidizing agents, such as fluorine, but uses non-oxidative gases such as hydrogen gas or nitrogen gas to reduce the damage to the substrate or to the elements thereon as much as possible.

Figure 4:
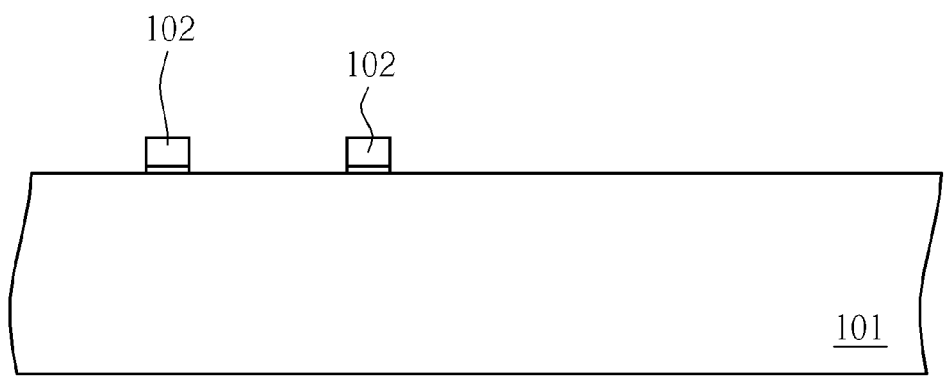

Later, as shown in FIG. 4, a photoresist-stripping step is carried out on the substrate 101. The photoresist-stripping step may preferably completely remove the patterned photoresist 110. The photoresist-stripping step may be carried out in a conventional way, such as by a wet cleaning step. For example, a sulfuric-peroxide mix may be used to remove the patterned photoresist 110. Or, an ammonia-peroxide mix may be used to remove the patterned photoresist 110. Because the patterned photoresist 110 has undergone the non-oxidative pre-treatment, it gets easier to be stripped. So, the following photoresist-stripping step not only can completely remove the patterned photoresist 110 but also remain the substrate 101, such as the poly line 102, substantially intact.

Because the method of the present invention employs a non-oxidative pre-treatment on the substrate, on one hand the photoresist material layer may be conveniently removed, and on the other hand it keeps the poly line on the substrate intact. The method of the present invention has the advantages of breaking through the barrier of the conventional approaches.

Those skilled in the art will readily observe that numerous modifications and alterations of the device and method may be made while retaining the teachings of the invention.

The invention claimed is:

1. A method for removing a photoresist, comprising:
providing a substrate comprising a patterned photoresist;
performing an ion implantation on said substrate;
performing a non-oxidative pre-treatment on said substrate, wherein said non-oxidative pre-treatment provides hydrogen, a carrier gas and plasma; and
performing a photoresist-stripping step so that said patterned photoresist is completely removed, wherein said photoresist-stripping step substantially does not damage said substrate.

2. The method for removing a photoresist of claim 1, wherein said substrate comprises Si.

3. The method for removing a photoresist of claim 1, wherein said ion implantation is a light drain doping (LDD).

4. The method for removing a photoresist of claim 1, wherein said non-oxidative pre-treatment comprises a plasma ashing step to damage said photoresist.

5. The method for removing a photoresist of claim 1, wherein said carrier gas comprises an inert gas.

6. The method for removing a photoresist of claim 1, wherein said non-oxidative pre-treatment is carried out in a stepwise temperature.

7. The method for removing a photoresist of claim 6, wherein said stepwise temperature is carried out in a range between 150 seconds to 300 seconds.

8. The method for removing a photoresist of claim 1, wherein a sulfuric-peroxide mix is used in said photoresist-stripping step.

9. The method for removing a photoresist of claim 1, wherein an ammonia-peroxide mix is used in said photoresist-stripping step.

10. The method for removing a photoresist of claim 1, wherein said photoresist-stripping step is a wet cleaning step.

11. The method for removing a photoresist of claim 1, wherein said substrate is free of low k dielectric material.

12. A method for removing a photoresist, comprising:
providing a substrate comprising a patterned photoresist;
performing an ion implantation on said substrate;
performing a non-oxidative pre-treatment on said substrate, wherein said non-oxidative pre-treatment provides hydrogen, a carrier gas and plasma; and
performing a photoresist-stripping step so that said patterned photoresist is completely removed, wherein said non-oxidative pre-treatment is carried out in a stepwise temperature condition, the stepwise temperature condition is for the substrate to be heated in a first step for 300 seconds away at a farther distance from the heat source, and then is heated in a second step for another 150 seconds at a closer distance to the heat source.

13. A method for removing a photoresist, comprising:
providing a substrate comprising a patterned photoresist;
performing an ion implantation on said substrate;
performing a non-oxidative pre-treatment on said substrate in the absence of UV radiation, wherein said non-oxidative pre-treatment provides hydrogen, a carrier gas and plasma; and
performing a photoresist-stripping step so that said patterned photoresist is completely removed.

* * * * *